United States Patent [19]

Akiyama et al.

[11] Patent Number: 5,043,252

[45] Date of Patent: Aug. 27, 1991

[54] DEVELOPER COMPOSITION FOR PS PLATES FOR USE IN MAKING LITHOGRAPHIC PRINTING PLATE AND METHOD OF PLATE-MAKING

[75] Inventors: Keizi Akiyama; Hiroshi Misu, both of Shizuoka, Japan

[73] Assignee: Fuji Photo Film Co., Ltd., Minami-Ashigara, Japan

[21] Appl. No.: 499,695

[22] Filed: Mar. 27, 1990

[30] Foreign Application Priority Data

Mar. 29, 1989 [JP] Japan .................................. 1-77517

[51] Int. Cl.$^5$ .............................................. G03C 5/00
[52] U.S. Cl. .................................. 430/331; 430/309; 430/325; 430/438; 430/481; 430/485
[58] Field of Search ............... 430/309, 325, 331, 438, 430/481, 485

[56] References Cited

U.S. PATENT DOCUMENTS

| | | | |
|---|---|---|---|
| 3,002,997 | 10/1961 | Green et al. | 430/485 |
| 3,061,434 | 10/1962 | Green et al. | 430/481 |
| 4,370,406 | 1/1983 | Jones | 430/309 |
| 4,467,027 | 8/1984 | Yamamoto et al. | 430/309 |
| 4,626,492 | 12/1986 | Eilbeck | 430/331 |
| 4,711,836 | 12/1987 | Ferreira | 430/326 |

FOREIGN PATENT DOCUMENTS

| | | | |
|---|---|---|---|
| 33163 | 10/1979 | Japan | 430/485 |
| 48763 | 3/1984 | Japan | 430/331 |
| 2083238 | 3/1982 | United Kingdom . | |

*Primary Examiner*—Hoa Van Le
*Attorney, Agent, or Firm*—Burns, Doane, Swecker & Mathis

[57] ABSTRACT

A developer composition which comprises an aromatic compound having hydroxyl groups at the 1- and 3-positions thereof and free of any electron attractive group or a salt thereof, an alkaline agent and water. The developer composition can effectively be used, as a developer, in a method for making lithographic printing plates which comprises the steps of: exposing, to light, a presensitized plate for use in making a lithographic printing plate provided with a water-insoluble image-forming layer formed on a substrate and developing the plate to remove non-image portions. Lithographic printing plates manufactured according to the method provide printed matter free of background contamination. If the pH value of the developer is controlled to not less than 12, both positive-working and negative-working presensitized plate can be treated therewith. Moreover, if the developer composition is employed, the working efficiency is greatly improved since it is not necessary to previously provide two kinds of developer compositions and two kinds of developing machines. Besides, initial cost can be saved and the space for installing such machines are also greatly reduced.

27 Claims, No Drawings

DEVELOPER COMPOSITION FOR PS PLATES FOR USE IN MAKING LITHOGRAPHIC PRINTING PLATE AND METHOD OF PLATE-MAKING

BACKGROUND OF THE INVENTION

The present invention relates to a developer composition for presensitized plates for use in making lithographic printing plates (hereunder referred to as "developer composition for PS plate") and a plate-making method in which such a developer composition is employed and more specifically to a developer composition for removing portions (which serving as non-image areas) of negative-working and/or positive-working PS plates and a plate-making method in which the developer composition is employed.

Japanese Patent Publication for Opposition Purpose (hereunder referred to as "J.P. KOKOKU") No. Sho 56-39464 discloses a developer composition for removing non-image areas of a light-sensitive layer which comprises a weak alkaline aqueous solution-soluble organic high molecular weight polymer and a light-sensitive diazo resin. However, this developer composition does not always show ability of completely dissolving even the light-sensitive layer in non-exposed areas adjacent the surface of a substrate. For this reason, background contamination is correspondingly caused when printing operation is performed using a lithographic printing plate obtained by developing a PS plate with this developer composition.

It is known that a drawback of this kind can be eliminated by the addition of a sulfite such as those disclosed in J.P. KOKOKU No. Sho 56-42860 (U.S. Pat. No. 4,186,006) to the foregoing developer composition. The problem of such background contamination of non-image areas during printing can surely be eliminated by the addition of a reducing inorganic sulfite, but if the developer is stored for a long time period, a part of the sulfite is oxidized. This leads to the reduction in the contamination-inhibitory effect of the developer.

On the other hand, as a developer containing hard water is deteriorated, a binder is separated out from the developer, which possibly results in the formation of sludge. On adding a chelating agent (a hard water softener) to such a developer for preventing the formation of sludge, the oxidation of the sulfite is accelerated.

On the other hand, a PS plate carrying a positive-working light-sensitive layer has also been widely used like PS plates provided with negative-working light-sensitive layers. However, the composition of developers for the positive-working PS plate in general differs from that of developers for the negative-working ones. Therefore, a plurality of developing machines are required for treating both positive- and negative-working PS plates. This leads to an increase in the operating cost. In addition, the space for installing the developing machines is too great and the operating efficiency is also insufficient.

SUMMARY OF THE INVENTION

Accordingly, an object of the present invention is generally to solve the foregoing problems and more specifically to provide a developer composition having excellent developing properties and capable of providing lithographic printing plates which cause no background contamination during printing.

Another object of the present invention is to provide a developer composition which can be stored for a long period of time without causing any deterioration.

A further object of the present invention is to provide a developer composition which can be used to develop both positive-working and negative-working PS plates.

A still further object of the present invention is to provide a method for making lithographic printing plates from PS plates with the use of the foregoing developer composition of the present invention.

The inventors of this invention have conducted various studies to achieve the aforementioned objects and have found that the foregoing drawbacks associated with the conventional developer compositions can be eliminated by the use of an aromatic compound having hydroxyl groups at the 1- and 3-positions thereof and free of any electron attractive group or a salt thereof. Furthermore, the inventors have also found that the developer containing such an aromatic compound can develop not only negative-working light-sensitive materials but also positive-working light-sensitive materials provided with a light-sensitive layer which comprises an o-quinonediazide compound and an organic high molecular weight polymer if the pH value of the developer is adjusted to not less than 12. The present invention has thus been completed on the basis of these findings.

According to an aspect of the present invention, there is provided a developer composition which comprises an aromatic compound having hydroxyl groups at the 1- and 3-positions thereof and free of any electron attractive group or a salt thereof, an alkaline agent and water.

According to another aspect of the present invention, there is provided a method for making lithographic printing plates which comprises the steps of: exposing, to light, a PS plate provided with a water-insoluble image-forming layer formed on a substrate and treating the plate with a developer to remove non-image portions wherein the developer is an aqueous alkaline solution containing an aromatic compound having hydroxyl groups at the 1- and 3-positions thereof and free of any electron attractive group or a salt thereof.

DETAILED EXPLANATION OF THE INVENTION

The developer composition and the plate-making method of the present invention will hereunder be described in more detail.

As an aromatic compound having hydroxyl groups at the 1- and 3-positions thereof and free of any electron attractive group or the salt thereof, there may be mentioned, for instance, compounds represented by the following general formula (I):

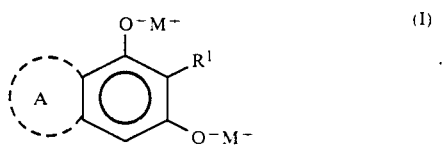

wherein A represents a hydrogen atom or a fused ring which may have substituents; $R^1$ represents a hydrogen atom, a lower alkyl group or a lower alkoxy group; and M represents a hydrogen atom, an alkali metal atom or an ammonium group.

The A of formula (I) preferably represents a hydrogen atom, a phenyl ring or a naphthyl ring. The fused ring also includes those having at least one substituent. Examples of such substituents include alkyl groups having 1 to 12 carbon atoms, alkenyl groups having 2 to 12 carbon atoms and aralkyl groups having 7 to 12 carbon atoms.

As the lower alkyl and alkoxy groups represented by $R^1$, preferred are those having 1 to 6 carbon atoms and a methyl group is particularly preferable as the alkyl group.

Preferred examples of the alkali metal atoms represented by M include lithium, sodium and potassium atoms and preferred ammonium groups are those represented by the general formula: $NR^2R^3R^4R^5$ (wherein $R^2$ to $R^5$ may be the same or different and each preferably represents a hydrogen atom or a lower alkyl group having 1 to 6 carbon atoms which may have substituents.

Particularly preferred examples of the compounds represented by formula (I) will be listed below. The following compounds may of course be in the form of salts thereof and the present invention is not restricted to these specific compounds.

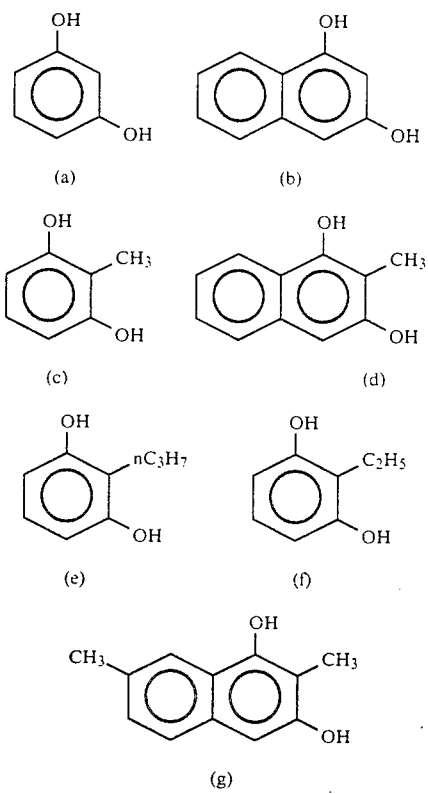

In the developer composition of the invention, these aromatic compounds may be used alone or in combination. The amount thereof used preferably ranges from 0.001 to 10% by weight on the basis of the total weight of the developer composition. This is because if it is used in an amount of less than 0.001% by weight, the resulting developer composition does not show sufficient ability to prevent contamination of non-image areas. On the other hand, if it exceeds 10% by weight, the mechanical strength of photohardened portions of light-sensitive layers on a PS plate treated with the developer composition are deteriorated and hence the printing durability of the lithographic printing plate thus obtained is possibly impaired.

Examples of the alkaline agents used in the developer composition of the present invention include inorganic alkaline agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, sodium borate, ammonium borate and ammonia; and organic amine compounds such as monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine and pyridine. These alkaline agents may be employed alone or in combination.

Preferred examples of the alkaline agents are sodium silicate, potassium silicate, sodium hydroxide, potassium hydroxide, monoethanolamine, diethanolamine, and triethanolamine which may be used alone or in combination.

The amount of these alkaline agents generally ranges from 0.05 to 10% by weight and preferably 0.1 to 7% by weight on the basis of the total weight of the developer composition practically used.

The developer composition of the present invention may optionally comprise at least one anionic surfactant. Moreover, it is also possible to add at least one organic solvent to the developer composition.

Examples of the anionic surfactants are sodium salt of lauryl alcohol sulfate; sodium salt of octyl alcohol sulfate; ammonium salt of lauryl alcohol sulfate; salts of higher alcohol sulfuric acid esters having 8 to 22 carbon atoms such as secondary sodium alkylsulfates; salts of aliphatic alcohol phosphoric acid esters such as sodium salt of cetyl alcohol phosphoric acid ester; salts of alkylarylsulfonic acids such as sodium salt of dodecylbenzenesulfonic acid, sodium salt of isopropylnaphthalenesulfonic acid and sodium salt of metanitrobenzenesulfonic acid; alkylaryl carboxylic acid salts such as sodium 4-n-butylbenzoate and potassium 4-t-butylbenzoate; sulfonic acid salts of alkylamides such as $C_{17}H_{33}CON(CH_3)CH_2CH_2SO_3Na$; sulfonic acid salts of dibasic aliphatic acid esters such as sodium dioctyl sulfosuccinate and sodium dihexyl sulfosuccinate; and salts of aryloxyalkylene sulfuric acid esters such as dipotassium 8-(2-naphthyloxy)-3,6-dioxaoctyl disulfate.

Preferred anionic surfactants used in this invention include those represented by the following general formula (II):

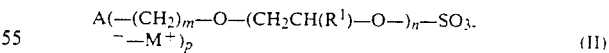

(II)

In formula (II), A represents an optionally substituted aryl group; $R^{1'}$ represents a hydrogen atom or a lower alkyl group; M represents a hydrogen atom, an alkali metal or an ammonium group; m is O or an integer of not less than 1, n is O or a positive number provided that m and n are not zero simultaneously; and p is an integer of 1 to 5.

The aryl group A is preferably a phyenyl or naphthyl group, more preferably a naphthyl group. The aryl group may have at least one substituent. Preferred examples of such substituents include alkyl groups having 1 to 18, preferably 1 to 12 carbon atoms, alkenyl groups having 2 to 18 carbon atoms, aralkyl groups having 7 to 18 carbon atoms, alkoxy groups having 1 to 18 carbon atoms, nitro group, and halogen atoms. Examples of lower alkyl groups, $R^1$, include those having 1 to 3 carbon atoms and preferably methyl group. Preferred examples of alkali metal M include sodium and potassium and examples of ammonium group include $NH_4$ and $NH(C_2H_5)_3$. m represents O or an integer of not less than 1, preferably O or an integer ranging from 1 to 5 and more preferably O. n represents O or a positive number, preferably O or a number of up to 30. n herein means an average added mole number of oxides. Therefore, the compounds represented by the foregoing formula (II) of course include mixtures of those differing in the added mole number of oxides. In addition, m and n cannot be zero simultaneously as already mentioned above. p is an integer of 1 to 5 and in particular 1 or 2.

Particularly preferred compounds represented by the general formula (II) will be listed below, but the invention is not restricted to these specific examples.

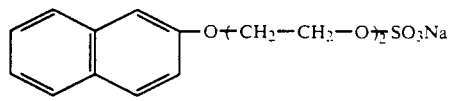  (1)

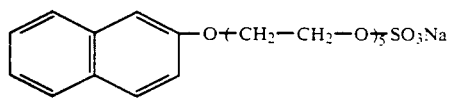  (2)

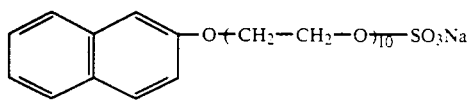  (3)

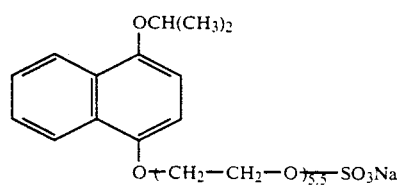  (4)

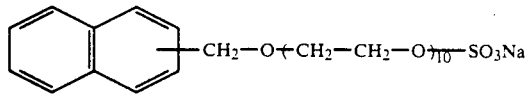  (5)

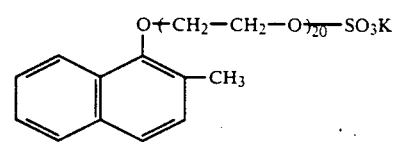  (6)

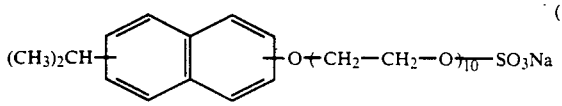  (7)

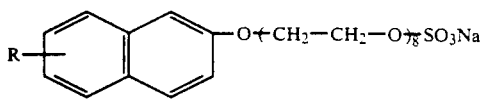  (8)

R: mixture of $-C_6H_{13}$ and $-C_7H_{15}$

-continued

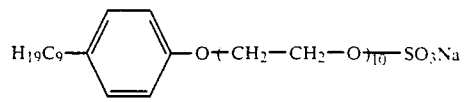  (9)

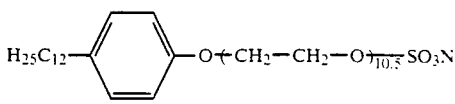  (10)

The compounds of the formula (II) can be prepared by the process disclosed in J.P. KOKAI No. Sho 59-195641 (U.S. Ser. No. 601,814 filed Apr. 19, 1984, now abandoned).

These anionic surfactants may be used alone or in combination. Particularly preferred is a combination of the surfactant represented by formula (II) and an alkyl aryl sulfonic acid salt.

These anionic surfactants are used in the developer composition in an amount suitably ranging from 0.1 to 5% by weight with respect to the total weight of the developer composition practically employed. This is because if it is less than 0.1% by weight, the effect thereof cannot be expected, while if it exceeds 5% by weight, for instance, dyes contained in a photohardened light-sensitive layer are dissolved out in excess and the mechanical and chemical strength of the photohardened images is deteriorated.

The organic solvents which may be added to the developer composition are preferably selected from those having a solubility in water of not more than about 10% by weight, in particular not more than 5% by weight. Examples of the organic solvent include 1-phenylethanol, 2-phenylethanol, 3-phenylpropanol-1,4-phenylbutanol-1,4-phenylbutanol-2,2-phenylbutanol-1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol.

The amount of the organic solvents preferably ranges from 1 to 5% by weight with respect to the total weight of the developer composition practically employed. The amount of the organic solvent is closely related to that of the surfactant. More specifically, the amount of the anionic surfactant should be increased with the increase in that of the organic solvent. This is because if the amount of the anionic surfactant is low and that of the organic solvent is great, the organic solvent is not solubilized in water and as a result, good developing properties of the composition cannot be ensured.

The developer composition of the invention may optionally comprise additives such as antifoaming agents and/or water softeners. Examples of water softeners include polyphosphates such as $Na_2P_2O_7$, $Na_5P_3O_3$, $Na_3P_3O_9$, $Na_2O_4P(NaO_3P)PO_3Na_2$ and Calgon (trade name of sodium polymetaphosphate, available from Calgon Inc. (U.S.A.)); polyaminocarboxylic acids and salts thereof such as ethylenediaminetetraacetic acid and potassium and sodium salts thereof, diethylenetriaminepentaacetic acid and potassium and sodium salts thereof, triethylenetetraminehexaacetic acid and potassium and sodium salts thereof, hydroxyethylethylenediaminetriacetic acid and potassium and sodium salts thereof, nitrilotriacetic acid and potassium and sodium salts thereof, 1,2-diaminocyclohexanetetraacetic acid and potassium and sodium salts thereof and 1,3-diamino-2-propanoltetraacetic acid and potassium and sodium salts thereof; and organophosphonic acids, potassium, sodium and ammonium salts thereof such as amino tri(methylene phosphonic acid), ethylenediamine tetra(methylene phosphonic acid), diethylenetriamine penta(methylene phosphonic acid), triethylenetetramine hexa(methylene phosphonic acid), and hydroxyethylethylenediamine tri(methylene phosphonic acid).

The optimum amount of the water softener varies depending on the hardness and the amount of hard water used, but the amount thereof in general ranges from 0.01 to 5% by weight and preferably 0.01 to 0.5% by weight on the basis of the total weight of the developer composition practically used.

It is preferable to store an aqueous solution (Solution A) containing a compound of formula (I) and an aqueous solution (Solution B) containing an alkaline agent and to combine Solutions A and B when used to prepare the developer composition of the present invention. Anionic surfactants, organic solvents, water softeners and/or antifoaming agents, if they are used, may be added to Solution A, Solution B or both.

The PS plates which have been treated with the developer of the invention may optionally be subjected to water washing followed by a desensitization treatment; to a desensitization treatment without water washing; to a treatment with an aqueous solution containing an acid; or to a treatment with an aqueous solution containing an acid followed by a desensitization treatment.

Moreover, in the developing process of the PS plate of this kind, the working efficiency of the developer is reduced due to the reduction of the alkali concentration. The reduction of the alkali concentration is caused due to consumption thereof with the quantity of PS plates processed and oxidation by air observed after a long run of an automatic developing machine. The working efficiency of the developer may be restored by the supplementation of a replenisher for developer as disclosed in Japanese Patent Un-examined Publication (hereunder referred to as "J.P. KOKAI") No. Sho 54-62004.

The light-sensitive diazo resins to be incorporated into negative-working light-sensitive layers to which the developer of the invention is applied are those disclosed in U.S. Pat. Nos. 2,679,498; 3,050,502; 3,163,633; and 3,406,159; and J.P. KOKOKU Nos. Sho 49-48001 and Sho 49-45322, which are made substantially water-insoluble and organic solvent-soluble according to the methods disclosed in J.P. KOKOKU No. Sho 47-1167, U.S. Pat. No. 3,300,309; J.P. KOKAI Nos. Sho 54-98613, Sho 56-121031, Sho 59-78340, Sho 59-22834 and Sho 63-262643. More specifically, the light-sensitive diazo resins are first synthesized in the form of inorganic salts such as zinc chloride complex salts and then converted into salts with organic compounds having phenolic hydroxyl groups or sulfonate groups or both of them, or into salts with hexafluorophosphoric acid or tetrafluoroboric acid or complex salts thereof to thus make the light-sensitive diazo resins water-insoluble.

In the light-sensitive layer of PS plates, a hydrophobic resin is in general used in combination with the foregoing substantially water-insoluble diazo resin and various such hydrophobic resins are known and used in this field. These hydrophobic resins are substantially selected, in the present invention, depending on requirements specific to each plate-making technique. Of course, the resins must be lyophilic to impart sufficient ink receptivity to the resulting lithographic printing plates, must further be physically and chemically compatible with the light-sensitive diazo resins which are soluble in the usual organic solvents and hardly soluble or completely insoluble in water and must have film-forming ability. In particular, the resin is desirably those having hardness, elasticity and flexibility to some extent since the resin serves as a substrate which is excellent in compatibility with ink and on which an ink film is formed. Thus the resin on the substrate can withstand the friction during printing operation to provide several tens of thousands to several hundreds of thousands of printed matters.

Examples of the resins which satisfy the foregoing requirements include epoxy resins; polyamide resins; halogenated vinyl resins, in particular polyvinyl chloride; polyvinylidene chloride; chlorinated polyolefins; polyvinyl acetates; acetal resins such as formals and butyrals; soluble urethane resins such as those available from GOODRICH CO., LTD. (U.S.A.) under the trade name of ESTANE; styrene/maleic anhydride copolymers, their half esters or half amides; cellulose derivatives; shellac, rosin or modified products thereof; acrylic acid/acrylate copolymers; multicomponent copolymers of 2-hydroxyethyl (meth)acrylate, (meth)acrylonitrile, (meth)acrylic acid and optional other copolymerizable monomers as disclosed in J.P. KOKAI No. Sho 50-118802 (U.S. Pat. No. 4,123,276); multicomponent copolymers of (meth)acrylic acid which is esterified with dicarboxylic acid ester residue and has a hydroxyl group at its end, (meth)acrylic acid and optional other copolymerizable monomers as disclosed in J.P. KOKAI No. Sho 53-120903; multicomponent copolymers of a monomer having aromatic hydroxyl groups (such as N-(4-hydroxyphenyl) methacrylamide), (meth)acrylic acid and optional other copolymerizable monomers as disclosed in J.P. KOKAI No. Sho 54-98614 and U.S. Pat. No. 4,731,316; and multicomponent copolymers of alkyl acrylates, (meth)acrylonitrile and unsaturated carboxylic acids as disclosed in J.P. KOKAI No. Sho 56-4144 (U.S. Pat. No. 4,304,832).

In addition, acidic polyvinyl alcohol derivatives and acidic cellulose derivatives are also useful in the invention. Other useful examples of the hydrophobic resins include high molecular weight polymers obtained by making polyvinyl acetals or polyurethanes alkali-soluble such as those disclosed in J.P. KOKOKU No. Sho 54-19773 (U.S. Pat. No. 3,732,105) and J.P. KOKAI Nos. Sho 57-94747 (U.S. Pat. No. 4,387,151), Sho 60-182437 (U.S. Pat. No. 4,631,245), Sho 62-58242 and Sho 62-123453 (B.P. No. 2,185,120).

A light-sensitive solution for forming a light-sensitive layer is in general prepared by dissolving the water-insoluble diazo resin and the foregoing hydrophobic resin in a proper solvent such as lower alcohols, glycol ether, dialkylformamides, chlorinated solvents or a mixture thereof, optionally adding a dye or a pigment to color the solution and optionally adding other components such as plasticizers, dyes for printing out and stabilizers. The light-sensitive layer of a negative-working PS plate can be obtained by applying the light-sensitive layer on a proper substrate and then drying.

On the other hand, the positive-working light-sensitive layer to which the developer of the invention is applied can be obtained from compositions which have been known as positive-working light-sensitive compositions containing o-quinonediazide compounds. Particularly preferred are those obtained from light-sensitive compositions containing o-quinonediazide compounds and phenolic resins.

The o-quinonediazide compounds are those which have at least one o-quinonediazide group and whose alkali-solubility is enhanced by irradiating with actinic rays. Such o-quinonediazide compounds which can be employed in the present invention may have a variety of structures. These o-quinonediazide compounds are detailed in "Light-Sensitive Systems", J. Koser, published by John Wiley & Sons, Inc. (pp. 339-352). Particularly preferred are sulfonic acid esters or sulfonamides of o-quinonediazide obtained through a reaction with aromatic polyhydroxyl compounds or aromatic amine compounds.

The most preferred o-quinonediazide compounds are esters of benzoquinone-(1,2)-diazidosulfonic acid chloride or naphthoquinone-(1,2)-diazidosulfonic acid chloride with pyrogallol-acetone resin as disclosed in J.P. KOKOKU No. Sho 43-28403 (U.S. Pat. No. 3,635,709). Other preferred o-quinonediazide compounds are, for instance, esters of benzoquinone-(1,2)-diazidosulfonic acid chloride or naphthoquinone-(1,2)-diazidosulfonic acid chloride with phenol-formaldehyde resin as disclosed in U.S. Pat. Nos. 3,046,120 and 3,188,210.

Examples of further preferred o-quinonediazide compounds include those known and disclosed in a variety of patents such as J.P. KOKAI Nos. Sho 47-5303, Sho 48-63802, Sho 48-63803, Sho 48-96575, Sho 49-38701 and Sho 48-13354, J.P. KOKOKU Nos. Sho 41-11222, Sho 45-9610 and Sho 49-17481, U.S. Pat. Nos. 2,797,213; 3,454,400; 3,544,323; 3,573,917; 3,674,495 and 3,785,825; U.K. Patent Nos. 1,227,602; 1,251,345; 1,267,005; 1,329,888 and 1,330,932; and German Patent No. 854,890.

The positive-working light-sensitive composition may comprise only o-quinonediazide compounds such as those listed above, but preferably the o-quinonediazide compounds are used in combination with a binder. Preferred examples of such binders are aqueous alkaline solution-soluble novolak resins. Typical examples thereof include phenol-formaldehyde resins, cresol-formaldehyde resins, phenol-cresol-formaldehyde resins, p-tert-butylphenol-formaldehyde resins and phenol-modified xylene resins.

Besides, polyvinyl compounds having phenolic hydroxyl groups such as polyhydroxystyrene polymers and copolymers thereof; and halogenated polyhydroxystyrene polymers and copolymers thereof are also useful as the binder.

The amount of the o-quinonediazide compounds preferably ranges from 10 to 50% by weight and more preferably 20 to 40% by weight on the basis of the total weight of the light-sensitive composition. On the other hand, that of the resins having phenolic hydroxyl groups serving as binders ranges from 45 to 80% by weight and preferably 50 to 70% by weight on the basis of the total weight of the light-sensitive composition.

The positive-working light-sensitive composition may further comprise fillers, dyestuff, dyes, pigments, photolytically decomposable acid-generators such as 1,2-naphthoquinone-(2)-4-sulfonic acid chloride and/or fluorine atom-containing surfactants for improving coating properties of the composition as well as other additives and auxiliary agents usually employed in compositions of this kind. The amount of these additives varies depending on the kinds thereof, but in general ranges from 0.01 to 20% by weight and preferably 0.05 to 10% by weight on the basis of the total weight of the light-sensitive composition.

A light-sensitive solution for forming a positive-working light-sensitive layer is likewise prepared by dissolving the o-quinonediazide compound and the aforesaid resin as a binder in a proper solvent such as those listed above in connection with the negative-working light-sensitive layer and optionally adding other components such as those listed above. The light-sensitive layer of a positive-working PS plate can be obtained by applying the light-sensitive layer on a proper substrate and then drying.

The aforementioned light-sensitive layer (inclusive of both positive and negative ones) is applied onto the surface of a variety of substrates selected depending on purposes. Examples of materials for such substrates are paper; paper laminated with a plastic film of, for instance, polyethylene, polypropylene or polystyrene; a metal plate such as an aluminum (inclusive of alloys thereof), zinc or copper plate; a plastic film such as a cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film; and paper or a plastic film which is laminated with a foil of the foregoing metal or onto which one of the foregoing metal is deposited. Metal substrates such as aluminum plates are preferably employed in particular for manufacturing PS plates.

In the case of using a metal support having, in particular, aluminum surface, it is preferred that the support is subjected to a surface treatment such as graining treatment, dipping treatment in an aqueous solution of, for example, sodium silicate, potassium fluorozirconate or a phosphate, or an anodic oxidation treatment.

Furthermore, an aluminum plate which is grained and then subjected to a dipping treatment in an aqueous solution of sodium silicate is preferably used in this invention. Also, an aluminum plate subjected to an anodic oxidation treatment and then dipping treatment in an aqueous solution of an alkali metal silicate such as that described in U.S. Pat. No. 3,181,461 is suitably used. The aforesaid anodic oxidation treatment is carried out by passing electric current in an electrolyte composed an aqueous solution or non-aqueous solution of an inorganic acid (such as phosphoric acid, chromic acid, sulfuric acid, or boric acid), an organic acid (such as oxalic acid, or sulfamic acid), or a salt thereof singly or as a combination of the solutions, using an aluminum plate as the anode.

Also, the application of electrodeposition of silicate such as that described in U.S. Pat. No. 3,658,662 is effective in this invention.

Furthermore, a support electrolytically grained such as that disclosed in J.P. KOKAI No. Sho 46-27481, J.P. KOKAI Nos. Sho 52-58602 and Sho 52-30503, which is further subjected to a combined surface treatment of the above-described anodic oxidation treatment and sodium silicate treatment, is also useful.

Also, an aluminum support subjected to mechanical graining, chemical etching, electrolytic graining, anodic oxidation treatment, and further sodium silicate treatment such as that disclosed in J.P. KOKAI No. Sho 56-28893 may be used in the present invention.

Still further, an aluminum support which is subjected to the above-described surface treatment or treatments and then under-coated with a water-soluble resin such as polyvinylphosphonic acid, a polymer or a copolymer having a sulfonic group at the side chain, polyacrylic acid, a water-soluble metal salt (e.g., zinc borate), a yellow dye, and/or an amine may be used.

PS plates may be prepared by dissolving the foregoing light-sensitive composition in a proper solvent, applying the solution onto the surface of the aluminum substrate thus treated in an amount ranging from 0.1 to 7 g/m$^2$ and preferably 0.2 to 5 g/m$^2$ (determined after drying) and then drying the coated film.

A lithographic printing plate, which is obtained by imagewise exposing a negative-working PS plate to light from a light source rich in ultraviolet rays such as a metal halide lamp and then developing the PS plate with the developer composition of the present invention, can always provides printed matters free of background contamination. In addition, if the pH value of the developer of the present invention is controlled to not less than 12, a positive-working PS plate which is likewise imagewise exposed to light can also be developed with the developer of the invention and the resulting lithographic printing plate provides good printed matter.

As explained above, the developer composition of the present invention whose pH is adjusted to not less than 12 makes it possible to treat both negative-working and positive-working PS plates. For this reason, the working efficiency is greatly improved since it is not necessary to previously provide two kinds of developer compositions and two kinds of developing machines. Besides, initial cost can be saved and the space for installing such machines are also greatly reduced.

The developer composition of the present invention will hereunder be described in more detail with reference to the following non-limitative working Examples and the effects practically achieved by the present invention will also be discussed in detail in comparison with Comparative Examples.

EXAMPLES 1 AND 2 AND COMPARATIVE EXAMPLE 1

A 2S aluminum plate having a thickness of 0.15 mm was immersed in a 10% aqueous solution of sodium tertiary phosphate maintained at 80° C. for 3 minutes to degrease the plate. After the plate was grained with a nylon brush and a slurry of pumice stone as an abrasive, it was desmutted with a 3% aqueous solution of sodium aluminate maintained at 60° C. Subsequently, the aluminum plate was anodized in a 20% sulfuric acid solution for 2 minutes at a current density of 2 A/dm$^2$ and then treated with a 2.5% aqueous solution of sodium silicate at 70° C. for one minute. Then there was applied, to the surface of the aluminum plate, a solution of light-sensitive composition (hereunder referred to as "light-sensitive solution") which comprised 10 g of hexafluorophosphate of a condensate of p-diazodiphenylamine with paraformaldehyde (degree of PF$_6$ salt-substitution=89%), 90 g of 2-hydroxyethyl methacrylate/acrylonitrile/ethyl methacrylate/methacrylic acid (50/26/20/4 wt %; weight ratio of charged monomers), 1 g of sodium isopropylnaphthalene sulfonate, 2 g of phosphorous acid, 3 g of Victoria Pure Blue BOH (available from HODOGAYA CHEMICAL CO., LTD.), 7 g of tricresyl phosphate, 600 g of ethylene glycol monomethyl ether, 600 g of methanol and 600 g of ethylene dichloride and then the coated film of the solution was dried at 100° C. for 2 minutes to give a PS plate. The coated amount (determined after drying) of the light-sensitive layer was equal to 1.5 g/m$^2$.

The PS plates thus prepared were exposed to light and developed with a developer having the following composition with an automatic developing machine 800U (available from Fuji Photo Film Co., Ltd.). The lithographic printing plates obtained in Examples 1 and 2 never caused background contamination unlike the lithographic printing plate obtained in Comparative Example 1. The developers listed in Table I were diluted 1/10 (volume ratio) prior to use.

TABLE I

| | Amount (part by weight) | | |
|---|---|---|---|
| Component | Comp. Ex. 1 | Ex. 1 | Ex. 2 |
| 1-Phenylethanol | 85 | 85 | 85 |
| Triethanolamine | 30 | 30 | 30 |
| Monoethanolamine | 2 | 2 | 2 |
| Potassium naphthalene sulfonate | 25 | 25 | 25 |
| Water | 60 | 60 | 60 |
| Compound of formula (1) | — | (a) 3 | (b) 3 |
| EDTA (ethylenediaminetetraacetic acid) | 0.05 | 0.05 | 0.05 |
| pH | 10.7 | 10.5 | 10.5 |

EXAMPLE 3 AND COMPARATIVE EXAMPLE 2

300 g of ethylene glycol monoethyl ether was heated to 100° C. in a stream of nitrogen gas and there were dropwise added 70 g of 2-hydroxyethyl methacrylate, 80 g of acrylonitrile, 130 g of benzyl methacrylate, 20 g of methacrylic acid and 1.2 g of benzoyl peroxide thereto over 2 hours. 15 Minute after the dropwise addition, 300 g of ethylene glycol monomethyl ether and 0.3 g of benzoyl peroxide were added to the reaction mixture and the reaction was continued for additional 4 hours. After the completion of the reaction, the reaction mixture was diluted with methanol, poured into water to precipitate the resulting copolymer and the copolymer was dried in vacuo at 70° C. The acid value of the resulting 2-hydroxyethyl methacrylate copolymer (A) was found to be 40.2.

A light-sensitive solution having the following composition was applied onto the surface of an aluminum plate which had been subjected to the same treatments used in Examples 1 and 2 and then dried at 100° C. for 2 minutes to thus give a PS plate. The coated amount of the light-sensitive layer was 2.5 g/m$^2$ (determined after drying).

| Component | Amount (g) |
|---|---|
| 2-Hydroxyethyl methacrylate copolymer (A) | 87 |
| 2-Methoxy-4-hydroxy-5-benzoylbenzene sulfonate of the condensate of p-diazodiphenylamine and paraformaldehyde | 10 |
| Oil Blue #603 (triphenyl methane type oil-soluble dye; available from ORIENT CHEMICAL INDUSTRIES LTD.) | 3 |
| 2-Methoxyethanol | 600 |
| Methanol | 600 |
| Ethylene dichloride | 600 |

An original negative transparency was closely placed on the PS plate thus obtained, the plate was imagewise exposed to light from a 30 A carbon arc lamp at a distance of 80 cm for 50 seconds and then developed with each developer listed in Table II below with an automatic developing machine 800H (available from Fuji Photo Film Co., Ltd.). The result obtained are summarized in Table III given below.

TABLE II

| Component | Amount (g) | |
|---|---|---|
| | Comp. Ex. 2 | Ex. 3 |
| Sodium alkylnaphthalene sulfonate (available from Kao Atlas Co., Ltd. under the trade name of PELEX NBL) | 30 | 30 |
| Benzyl alcohol | 30 | 30 |
| Triethanolamine | 20 | 20 |
| Monoethanolamine | 4 | 4 |
| Nitrilotriacetic acid | 0.1 | 0.1 |
| Sodium sulfite | 3 | 0 |
| 2-Methylresorcin | 0 | 3 |
| Water to | 1000 ml | 1000 ml |
| pH | 10.6 | 10.4 |

TABLE III

| Ex. No. | Storage Time of Developer | Background Contamination Observed Under Forced Conditions (stored at 60° C. for 3 days) |
|---|---|---|
| Comp. Ex. 2 | 0 | no background contamination |
| | one year | slightly contaminated if the amount of dampening water is reduced. |
| Ex. 3 | 0 | no background contamination |
| | one year | no background contamination |

As seen from the results listed in Table III, if the developer composition containing 2-methylresorcin was used, the resulting lithographic printing plate caused no background contamination even when the developer was stored for a long time and when the plate was prepared from the PS plate which had been stored under the forced conditions (60° C. for 3 days).

EXAMPLE 4 AND COMPARATIVE EXAMPLE 3

An aluminum plate (1050) having a thickness of 0.24 mm was degreased by washing it with trichloroethylene, the surface of the plate was grained with a nylon brush and an aqueous suspension of pumice stone and then sufficiently washed with water. The plate was etched by immersing it in a 25% aqueous solution of sodium hydroxide maintained at 45° C. for 10 seconds, washed with water, then immersed in a 20% aqueous solution of nitric acid for 20 seconds and washed with water. The etched quantity of the plate was about 3 g/m$^2$. Then the plate was anodized with the use of a direct current at a current density of 15 A/dm$^2$ in a 7% sulfuric acid solution as an electrolyte to form an anodized layer (25 g/m$^2$), washed with water and dried. Thereafter, a light-sensitive solution having the following composition was applied onto the surface of the aluminum plate thus treated and dried at 100° C. for 90 seconds to give a positive-working PS plate. The amount of the light-sensitive layer applied was 2 g/m$^2$ (determined after drying).

| Light-sensitive Solution | |
|---|---|
| Component | Amount (g) |
| Esterified product of naphthoquinone-1,2-diazido-5-sulfonic acid chloride and pyrogallol/acetone resin (Note 1) | 0.90 |
| Cresol/formaldehyde resin | 1.70 |
| t-Butylphenol/formaldehyde resin (Note 2) | 0.05 |
| Naphthoquinone-1,2-diazido-4-sulfonic acid chloride | 0.03 |
| Tetrahydrophthalic acid anhydride | 0.20 |
| Oil Blue #603 (blue dye available from ORIENT CHEMICAL INDUSTRIES CO., LTD.) | 0.05 |
| Methyl ethyl ketone | 8 |
| Ethylene glycol monomethyl ether | 15 |

Note 1: The compound described in Example 1 of U.S. Pat. No. 3,635,709.
Note 2: The compound described in U.S. Pat. No. 4,123,279.

This positive-working PS plate was exposed to light from a 1.5 KW metal halide lamp at a distance of 90 cm and then developed with each of the developers listed in Table IV below with an automatic developing machine 800U (available from Fuji Photo Film Co., Ltd.).

As a result, lithographic printing plates from which the exposed portions were completely dissolved out and removed were obtained. In particular, when the developer of Example 4 was employed, the coupling between the decomposed o-quinonediazide and the undecomposed one was not observed even after 2 m$^2$/l of the PS plate was processed, the substrate was not contaminated by the coupling product and the resulting lithographic printing plate provided good printed matter free of background contamination.

On the other hand, when the developer of Comparative Example 3 was employed, the foregoing coupling was observed and the removal of the film-edge portion was necessary. Moreover, no background contamination was observed on the printed matter produced by the lithographic printing plate prepared by developing a negative-working PS plate used in Example 1 with the developer of Example 4. However, the lithographic printing plate obtained by the use of the developer of Comparative Example 3 produced printed matter having background contamination.

As has been explained above in detail, the processing of both negative-working and positive-working PS plates can be performed in the same automatic developing machine with the same developer, if the developer composition of the present invention is adopted.

TABLE IV

| Component | Amount (g) | |
|---|---|---|
| | Ex. 4 | Comp. Ex. 3 |
| Sodium naphthalene sulfonate | 4 | 4 |
| 2-Methylresorcin | 0.3 | 0 |
| pH | 13 | 13.1 |

*These developers were prepared by adding the compounds listed in Table IV to 1 l of a 2.5 wt % aqueous solution of potassium silicate (the molar ratio. SiO$_2$/K$_2$O, was 1.1).

What is claimed is:

1. A method for preparing a lithographic printing plate comprising the steps of:
   (i) imagewise exposing to light a presensitized plate comprising a substrate having thereon a negative working light-sensitive layer containing a diazo resin; and
   (ii) developing the imagewise light-exposed presensitized plate with a developer composition comprising an aqueous alkaline solution containing an aromatic compound having hydroxyl groups or a salt thereof at the 1- and 3-positions thereof and free of any electron attractive group to remove unexposed areas of the imagewise light-exposed light-sensitive layer.

2. The method of claim 1 wherein the aromatic compound is represented by the following general formula (I):

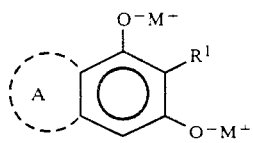

wherein A represents a hydrogen atom or a fused ring which may have substituents; $R^1$ represents a hydrogen atom, a lower alkyl group or a lower alkoxy group; and M represents a hydrogen atom, an alkali metal atom or an ammonium group.

3. The method claim 2 wherein in formula (I), A represents a hydrogen atom, a phenyl ring or a naphthyl ring which may be substituted with at least one substituent selected from the group consisting of alkyl groups having 1 to 12 carbon atoms, alkenyl groups having 2 to 12 carbon atoms and aralkyl groups having 7 to 12 carbon atoms; $R^1$ is a member selected form the group consisting of hydrogen atom, and alkyl and alkoxy groups having 1 to 6 carbon atoms; and M is a member selected from the group consisting of lithium, sodium and potassium atoms and ammonium groups represented by the general formula: $NR^2R^3R^4R^5$ wherein $R^2$ to $R^5$ may be the same or different and each represents a hydrogen atom or a lower alkyl group having 1 to 6 carbon atoms which may have substituents.

4. The method of claim 1 wherein the amount of the aromatic compound ranges from 0.001 to 10% by weight on the basis of the total weight of the developer composition.

5. The method of claim 1 wherein after the presensitized plate is developed, it is further subjected to water washing followed by a desensitization treatment; directly to a desensitization treatment without water washing; to a treatment with an aqueous solution containing an acid; or to a treatment with an aqueous solution containing an acid followed by a desensitization treatment.

6. The method of claim 1 wherein a replenisher for developer is supplemented to the developer during development processing.

7. The method according to claim 1 wherein the pH of the aqueous alkali solution is not less than 12.

8. The method according to claim 1 wherein the aqueous alkaline solution includes at least one alkali agent selected from the group consisting of sodium silicate, potassium silicate, potassium hydroxide, sodium hydroxide, lithium hydroxide, sodium tertiary phosphate, sodium secondary phosphate, ammonium tertiary phosphate, ammonium secondary phosphate, sodium metasilicate, sodium bicarbonate, sodium borate, ammonium borate, ammonia, monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine and pyridine.

9. The method according to claim 8 wherein the alkali agent is selected from the group consisting of sodium silicate, potassium silicate, potassium hydroxide, sodium hydroxide, monoethanolamine, diethanolamine and triethanolamine.

10. The method according to claim 8 wherein the amount of the alkali agent in the developer composition ranges from 0.05 to 10% by weight on the basis of the total weight of the composition.

11. The method according to claim 10 wherein the amount of the alkali agent in the developer composition ranges from 0.1 to 7% by weight on the basis of the total weight of the composition.

12. The method according to claim 1 wherein the developer further comprises at least one anionic surfactant selected from the group consisting of sodium salt of lauryl alcohol sulfate; sodium salt of octyl alcohol sulfate; ammonium salt of lauryl alcohol sulfate; salts of higher alcohol sulfuric acid esters having 8 to 22 carbon atoms; salts of aliphatic alcohol phosphoric acid esters; salts of alkylarylsulfonic acids; alkylaryl carboxylic acid salts; sulfonic acid salts of alkylamides; sulfonic acid salts of dibasic aliphatic acid esters; and salts of aryloxyalkylene sulfuric acid esters.

13. The method according to claim 12 wherein the anionic surfactant is added to the developer composition so that the amount thereof in the developer practically used ranges from 0.1 to 5% by weight on the basis of the total weight of the developer.

14. The method according to claim 1 wherein the developer further comprises at least one additional organic solvent having solubility in water of not more than about 10% by weight.

15. The method according to claim 14 wherein the organic solvent has solubility in water of not more than 5% by weight.

16. The method according to claim 14 wherein the organic solvent is at least one member selected from the group consisting of 1-phenylethanol, 2-phenylethanol, 3-phenylpropanol-1; 4-phenylbutanol-1; 4-phenylbutanol-2; 2-phenylbutanol-1; 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol.

17. The method according to claim 14 wherein the organic solvent is added to the developer composition so that the amount thereof in the developer ranges from 1 to 5% by weight on the basis of the total weight of the developer.

18. The method according to claim 1 wherein the developer further comprises antifoaming agents and/or water softener.

19. The method according to claim 18 wherein the water softener is added to the developer composition so that the amount thereof in the developer ranges from 0.01 to 5% by weight on the basis of the total weight of the developer.

20. A method for developing a presensitized plate which comprises the steps of;
(i) developing an imagewise light-exposed, positive working, presentized plate having a substrate with an imagewise light-exposed positive working light-sensitive layer containing an O-quinone diazide compound with a developer composition to remove light-exposed areas of the positive working light-sensitive layer, to provide a lithographic printing plate, and
(ii) developing an imagewise light-exposed, negative working, presensitized plate having a substrate with an imagewise light-exposed negative working light-sensitive layer containing a diazo resin with a developer composition to remove light-unexposed areas of the negative working light-sensitive layer, to provide a lithographic printing plate, said developer composition for the positive working presensitized plate and said developer composition for the negative working presensitized plate, each comprising at least one compound selected from the group consisting of an aromatic compound having hydroxyl groups or a salt thereof at the 1- and 3-positions thereof and free of any electron attractive group, at least one alkali agent and water, and having pH of not less than 12.

21. The method according to claim 20 wherein the aromatic compound is represented by the following general formula (I):

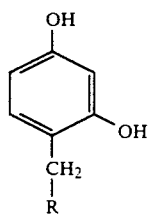

wherein A represents a hydrogen atom or a fused ring which may have substituents; $R^1$ represents a hydrogen atom, a lower alkyl group or a lower alkoxy group; and M represents a hydrogen atom, an alkali metal atom or an ammonium group.

22. The method according to claim 21 wherein in formula (I), A represents a hydrogen atom, a phenyl ring or a naphthyl ring which may be substituted with at least one substituent selected from the group consisting of alkyl groups having 1 to 12 carbon atoms, alkenyl groups having 2 to 12 carbon atoms and aralkyl groups having 7 to 12 carbon atoms; $R^1$ is a member selected from the group consisting of hydrogen atom, and alkyl and alkoxy groups having 1 to 6 carbon atoms; and M is a member selected from the group consisting of lithium, sodium and potassium atoms and ammonium groups represented by the general formula: $NR^2R^3R^4R^5$ wherein $R^2$ to $R^5$ may be the same or different and each represents a hydrogen atom or a lower alkyl group having 1 to 6 carbon atoms which may have substituents.

23. The method according to claim 20 wherein the amount of the aromatic compound ranges from 0.001 to 10% by weight on the basis of the total weight of the developer composition.

24. The method according to claim 20 wherein after the presensitized plate is developed, it is further subjected to water washing followed by a desensitization treatment; directly to a desensitization treatment without water washing; to a treatment with an aqueous solution containing an acid; or to a treatment with an aqueous solution containing an acid followed by a desensitization treatment.

25. The method according to claim 20 wherein the alkali agent is selected from the group consisting of sodium silicate, potassium silicate, potassium hydroxide, sodium hydroxide, monoethanolamine, diethanolamine and triethanolamine.

26. The method according to claim 20 wherein the developer further comprises at least one anionic surfactant selected from the group consisting of sodium salt of lauryl alcohol sulfate; sodium salt of octyl alcohol sulfate; ammonium salt of lauryl alcohol sulfate; salts of higher alcohol sulfuric acid esters having 8 to 22 carbon atoms; salts of aliphatic alcohol phosphoric acid esters; salts of alkylarylsulfonic acids; alkylaryl carboxylic acid salts; sulfonic acid salts of alkylamides; sulfonic acid salts of dibasic aliphatic acid esters; and salts of aryloxyalkylene sulfuric acid esters.

27. The method according to claim 20 wherein the developer further comprises at least one additional organic solvent having solubility in water of not more than about 10% by weight.

* * * * *